United States Patent [19]

Picone et al.

[11] Patent Number: 4,684,821
[45] Date of Patent: Aug. 4, 1987

[54] RESET CIRCUIT IN A MAGNETIC MODULATOR

[75] Inventors: John D. Picone, West Islip; Edward A. Cronauer, Massapequa Park, both of N.Y.

[73] Assignee: United Technologies Corporation, Hartford, Conn.

[21] Appl. No.: 825,020

[22] Filed: Jan. 31, 1986

[51] Int. Cl.$^4$ .............................................. H03K 5/04
[52] U.S. Cl. .................... 307/106; 307/108; 307/107; 328/67; 328/65
[58] Field of Search ............... 307/106, 107, 108, 109, 307/401, 402, 412–421, 282, 314, 246; 328/59, 60, 63, 65, 67, 74, 78; 363/22, 133, 24, 26, 31; 323/299; 330/47, 48; 331/157, 154, 87; 332/5

[56] References Cited

U.S. PATENT DOCUMENTS

| | | | |
|---|---|---|---|
| 3,296,551 | 1/1967 | Staples | 328/65 X |
| 3,392,285 | 7/1968 | Olson | 307/108 |
| 3,424,925 | 1/1969 | Gagliardi et al. | 328/67 X |
| 3,525,940 | 8/1970 | Quesinberry | 328/67 X |
| 3,538,383 | 11/1970 | Ritter et al. | 307/108 X |
| 3,590,279 | 6/1971 | Thompson | 328/67 X |
| 3,611,211 | 10/1971 | Theodore | 307/106 X |
| 3,619,647 | 11/1971 | Barkow | 307/402 X |
| 3,652,877 | 3/1972 | Smith | 328/67 X |
| 3,655,994 | 4/1972 | Malme | 307/106 X |
| 3,711,725 | 1/1973 | Johannessen | 307/107 X |
| 3,881,145 | 4/1975 | Tanigaki | 307/108 X |
| 3,928,809 | 12/1975 | Tschudi et al. | 328/67 X |
| 3,931,528 | 1/1976 | Farnsworth et al. | 307/108 |
| 4,160,214 | 7/1979 | Colin et al. | 328/65 |

Primary Examiner—William M. Shoop, Jr.
Assistant Examiner—Shik Luen Paul Ip
Attorney, Agent, or Firm—Eric W. Petraske; Robert P. Sabath

[57] ABSTRACT

In a magnetic modulator circuit (13) for a radar system, a switching reactor arrangement comprising a switching reactor (17) including input and output coils (respectively 16 and 36), the low side (16') of the input coil (16) being electrically connected to a capacitor (41) through reactor 39, said switching reactor effective for driving a pulse forming network (53), and said capacitor (41) being effective for resetting the switching reactor (17) into saturation with a linear inductor (15) spanning the input coil (16) of the switching reactor (17).

3 Claims, 7 Drawing Figures

RESET CIRCUIT IN A MAGNETIC MODULATOR

DESCRIPTION

1. Technical Field

The technical field of this invention includes electrical circuits and more particularly, reset circuits for maintaining reset in saturating the switching reactor in a magnetic modulator used in a radar system.

2. Background Art

Magnetic modulators have been used in radar systems for many years. In particular, magnetic modulators are used in radar systems to produce output radar pulses of particularly defined frequency an amplitude.

A typical magnetic modulator includes a switching reactor which needs to be reset after each transmitted pulse to make it ready for subsequent transmission. This is conveniently accomplished by supplying a charging current pulse to the storage capacitor in the magnetic modulator circuit.

Unfortunately, this method of resetting the switch reactor can disadvantageously couple energy into the pulse forming network, pulse transformer and load of the magnetic modulators, effectively disrupting modulator performance.

DISCLOSURE OF INVENTION

Pursuant to the invention herein, a small inductor is accordingly electrically connected across the primary winding of the switching reactor. This inductor temporarily stores energy received while charging the pulse forming network of the magnetic modulator during a previous cycle of operation. This energy subsequently drives the switching reactor into saturation (reset) after the radar transmitter has completed output pulse production, effectively resetting the switching reactor before the beginning of a next charging event for the storage capacitor.

Other features and advantages of the invention will be apparent from the specification and claims herein, and from the accompanying drawing which illustrates a preferred or best embodiment of the invention.

BEST MODE FOR CARRYING OUT THE INVENTION

Figure 1:
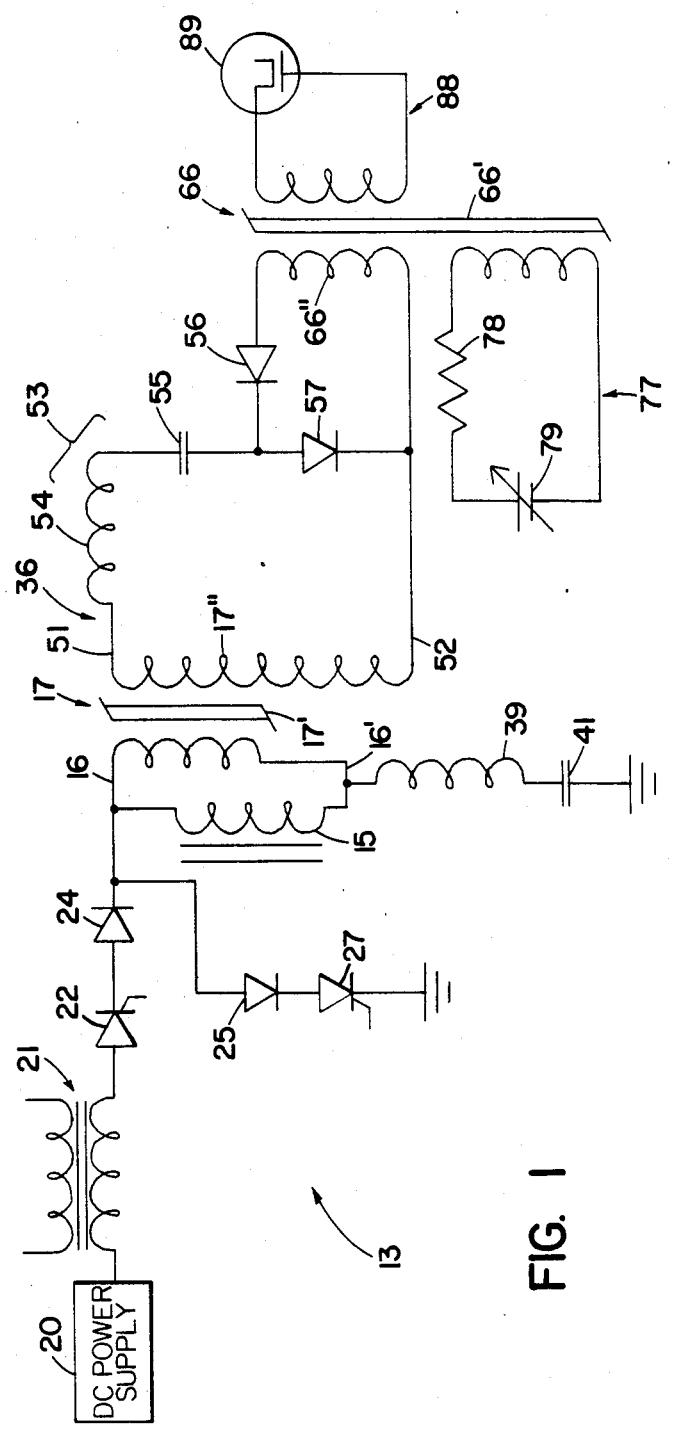
FIG. 1 is an electrical schematic of the magnetic modulator including a switching reactor according to the invention herein, in which an inductor spans the input coil or primary winding of the switching reactor.

FIG. 1 shows the magnetic modulator circuitry 13 of the invention herein, including the feature of a linear inductor 15 which spans the primary winding or input coil 16 of a saturable switching reactor 17 which is used to implement the function of modulator circuitry 13.

More particularly, there is shown in schematic form a DC power supply 20 and a charging transformer 21 connected through a silicon control rectifier (SCR) 22 and a diode 24 to the high side of the primary winding 16 of switching reactor 17. The charging transformer 21 and DC power supply 20 are used to provide energy to charge storage capacitor 41, as will be seen. Diode 24 further controls the direction of current toward the capacitor 41, and SCR 22 acts as a switch to control the time of charging.

The output of diode 24 is connected to a second diode 25 which leads through a so-called main bang SCR 27 in series to ground. Diode 25 and SCR 27 are connected in parallel to switching reactor 17, as will be seen below. Closure of SCR 27 effects discharge of capacitor 41 through both the primary 16 of reactor 17 and inductor 15. Its reopening at the end of discharge causes current circulation in reactor 17 and inductor 15 which resets reactor 17 into saturation during and after RF pulse transmission before recharging of capacitor 41 begins. The reset saturated state of reactor 17 prevents coupling of energy therethrough while storage capacitor 41 is recharging, thus effectively accomplishing as object of this invention.

Shunting inductor 15 is linear according to the version of the invention set forth herein. In other words, inductor 15 is set to operate in its linear region, thereby ensuring that it will not itself enter saturation. In partiuclar, the energy inductor 15 is able to carry considerably less than the energy transferred by the saturable reactor 17. The lower end 16' of primary 16 is in turn connected to an additional inductor 39, for timing purposes, and then through capacitor 41 to ground. In particular, inductor 39 ensures that the charging time of th pulse forming network 53 coincides with the time it takes for the switching reactor to saturate The output side 36 of switching reactor 17 has upper and lower nodes respectively 51 and 52, the upper node 51 including a pulse forming network 53 in turn including in series an inductor 54 and a capacitor 55 effective to perform the required pulse forming operation.

Upper node 51 of output side 36 is further connected through pulse forming network 53 to the input side of a pulse transformer 66 through diode 56. Additionally, diode 57 in turn connects pulse forming network 53 with lower node 52. The core 66' of transformer 66 is linked with bias circuit 77 including in series a resistor 78 and a variable DC power source 79 for tuning. The output side of transformer 66 is connected to a load circuit 88 including magnetron 89.

In operation, SCR 22 gates a discrete amount of energy from a DC power supply 20 and charging transformer 21 to storage capacitor 41. At this point, switching reactor 17 is desirably in saturation to prevent the passage of current through coils 16 from affecting pulse forming network 53. Subsequently, the energy from storage capacitor 41 is transferred into pulse forming network 53 by the closing of SCR switch 27. Only a small portion of the energy passes through inductor 15, as selected by sizing its inductance. Finally, the pulse forming network 53 transfers its energy into load circuit 88 through a pulse transformer 66, when switching reactor 17 switches to its set position or saturated state.

After the energy has been delivered to the load circuit 88, it is necessary to reset the saturable reactor 17 before beginning a next pulse transmission. Before the invention was made, this was effectively accomplished by transferring a discrete parcel of energy from the DC power supply 20 and applying it to storage capacitor 41, by conducting passage of the storage capacitor charging current through the primary winding 16 of the saturable reactor 17.

However, when this occurs, it is accompanied by an undesirable flux oscillation in the arrangement of the prior art not having a linear inductor. In other words, some of the charging current energy is coupled through the now unsaturated saturable reactor 17 into the pulse forming network capacitor 55 and ultimately through pulse transformer 66.

Figure 2:
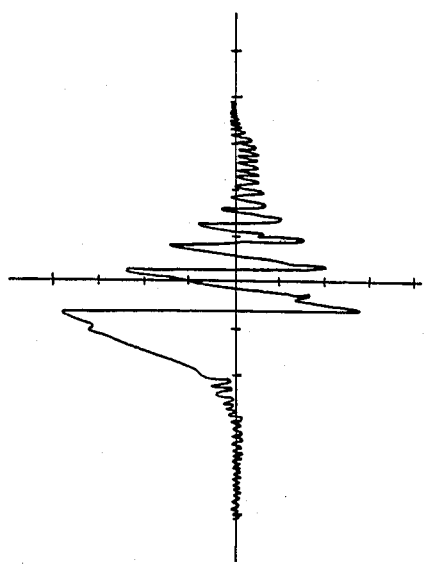
FIG. 2 shows the differential voltage at twenty (20) volts per division over time (50 sec per div) across the switching reactor primary without the inductor feature of the invention herein implemented at the time of storage capacitor charging.

As shown in FIG. 2, this causes the primary coil 16 of reactor 17 and the pulse forming network 53 to experience an undesirable voltage rise until the core 17' of saturable reactor 17 finally goes into saturation. The pulse forming network 53 in the arrangement of the prior art repeatedly discharges into the very low impedance of the saturable reactor secondary winding 17" as suggested in FIG. 2. This causes the pulse forming network 53 to discharge and its voltage to reverse repeatedly because of its low impedance and the underdamped state of the circuit. When the voltage reverses, the saturable reactor 17 comes out of saturation and the charging current from capacitor 41 is again coupled into the pulse forming network 53, thereby oscillating wildly.

Figure 3:
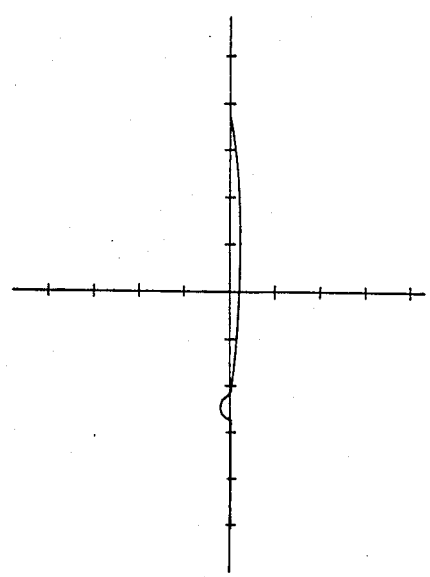
FIG. 3 shows the much smaller differential voltage swing across the switching reactor primary during capacitor charging with the invention herein implemented.

FIG. 3 illustrates clearly the elimination of oscillations in the voltage across the switching reactor primary in accordance with the invention herein. Both FIGS. 2 and 3 show the voltage across the saturable reactor primary during charging of capacitor 41, but FIG. 3 shows a much smaller voltage level, caused by spanning inductor 15 across the primary coil 16 of reactor 17. Each vertical division in FIGS. 2 and 3 represents twenty (20) volts; each horizontal division represents fifty (50) microseconds.

The oscillations thereby eliminated prevent upsets of core magnetization in transformer 66 which would cause the time core 66' saturation to vary with respect to the time of output pulses from modulator circuit 13. The invention accordingly promotes the proper shaping and production of output pulses from magnetic modulator 13.

The oscillations shown in FIG. 2 can be eliminated by resetting the switching reactor 17 into saturation before beginning to charge storage capacitor 41. If this is accomplished, the saturated state of switching reactor 17 will prevent undesired energy from being coupled into the pulse transformer 66.

This is preferably accomplished by electrically connecting a linear inductor 15 across the saturable reactor's primary winding 16. This will cause a reverse current to flow in the inductor 15, which is effective for resetting saturable reactor 17.

Further, when the saturable reactor 17 saturates, pulse forming network 53 discharges to zero or below zero volts, and the inductor 15 current starts to reset the saturable reactor core. The value of the energy of inductor 15, according to a preferred version of the invention, is selected so that its energy is sufficient to reset the core. In a preferred embodiment, the core reset energy can be determined as a direct function of the volume of core 17. The reset energy, moreover, preferably represents only a small part of the total energy stored in capacitor 41. For example, a core 17' with a four-turn primary and having a reset energy requirement of 4.5 millijoules can be employed under this invention in conjuction with a one (1) millihenry inductor 15 across the primary winding 16.

Figure 4:
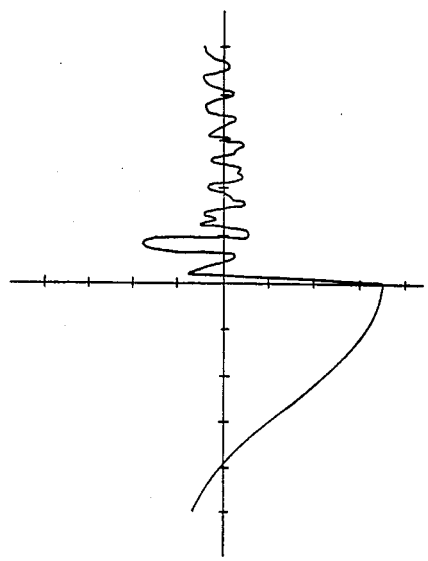
FIG. 4 is a curve showing the switching reactor primary voltage in 200 V/DIV and 24 seconds per DIV units during capacitor discharge transferring power into the pulse forming network with the inductor feature of the invention implemented.
Figure 5:
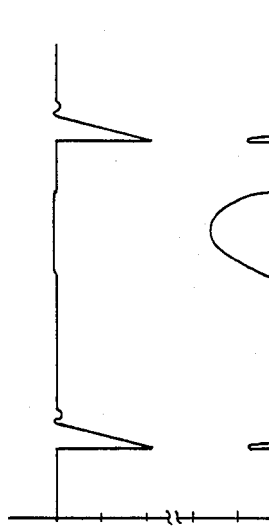
FIG. 5 shows respective linear inductor and capacitor currents over time during operation of the magnetic modulator, in corresponding units of two (2) and five (5) amperes per division and 200 microseconds per divison.

Accordingly, during discharge of capacitor 41, the voltage across the primary 16 would follow the shape of a cosine, as shown in inverted form in FIG. 4. By way of further detail, FIG. 5 shows respective currents in the primary of reactor 17 and capacitor 41 in corresponding top and bottom traces.

Figure 6:
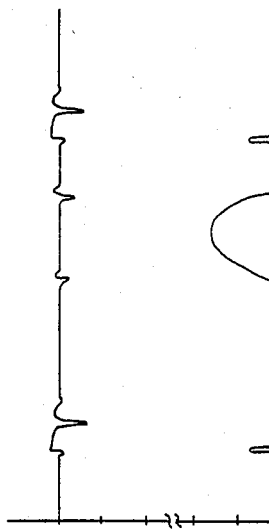
FIG. 6 shows voltage in the secondary of the output pulse transformer and the storage capacitor charging current with the invention implemented, in respective units of 500 volts and five (5) amperes per vertical division and 200 microseconds per horizontal division.
Figure 7:
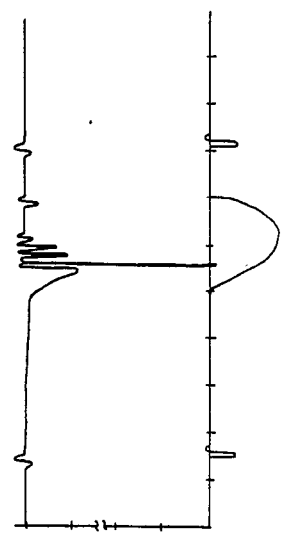
FIG. 7 shows the secondary voltage magnitude and the charging current through the switching reactor primary without the inductor feature implemented, using the same units as in FIG. 6.

FIG. 6 in its top trace shows the voltage across the pulse transformer secondary with the inductor 15 installed according to the invention. Finally, FIG. 7 shows the voltage across the pulse transformer secondary without inductor 15 installed. The undesired impact of the charging pulse in FIG. 7 is clearly much reduced by including inductor 15 with the result as indicated in FIG. 6.

It should be understood that the invention is not limited to the particular embodiments shown and described herein, but that various changes and modifications may be made without departing from the spirit and scope of this novel concept as defined by the following claims.

We claim:

1. A magnetic modulator circuit comprising a power source, a switching reactor means for providing power to a pulse forming network, said switching reactor means comprising cooperative input and output coils, each having a high and low side, a capacitor means for storing current from said power source, said capacitor being electrically connected with the low side of the input coils of said switching reactor means, and a switching means for switching the high side of said input coil selectively to connections including said power source and ground, whereby said capacitor means may be selectively charged from said power source and discharged through said input coil to ground, wherein the improvement comprises an inductor means for passing current, electrically connected in parallel with said input coil, whereby discharge of said capacitor means through said input coil will switch said switching reactor means to a saturated state until said switching means opens, at which time said switching reactor means enters said unsaturated state until energy stored in said inductor means forces a predetermined amount of current, sufficient to switch said switching reactor back into said saturated state, through said input coil to effect resetting of said switching reactor means into said saturated state.

2. The arrangement of claim 1, wherein the energy carried by said inductor means is less than the energy transferred by said switching reactor means.

3. The arrangement of claim 1, wherein said inductor means is linear.

* * * * *